United States Patent
Mao et al.

(10) Patent No.: US 10,126,893 B2
(45) Date of Patent: Nov. 13, 2018

(54) METHOD AND APPARATUS FOR CAPACITIVE SENSING

(71) Applicant: Nokia Technologies Oy, Espoo (FI)

(72) Inventors: Zhanwei Mao, Henan (CN); Jianfeng Zhu, Jiangsu (CN); Yu Wang, Beijing (CN); Jinjuan Liu, Beijing (CN)

(73) Assignee: Nokia Technologies Oy, Espoo (FI)

( * ) Notice: Subject to any disclaimer, the term of this patent is extended or adjusted under 35 U.S.C. 154(b) by 77 days.

(21) Appl. No.: 15/121,980

(22) PCT Filed: Mar. 4, 2014

(86) PCT No.: PCT/CN2014/072849
§ 371 (c)(1),
(2) Date: Aug. 26, 2016

(87) PCT Pub. No.: WO2015/131329
PCT Pub. Date: Sep. 11, 2015

(65) Prior Publication Data
US 2017/0068351 A1 Mar. 9, 2017

(51) Int. Cl.
*G06F 3/044* (2006.01)
*H03K 17/955* (2006.01)
*G06F 3/041* (2006.01)

(52) U.S. Cl.
CPC ............ *G06F 3/044* (2013.01); *G06F 3/0418* (2013.01); *H03K 17/955* (2013.01); *G06F 2203/04108* (2013.01); *H03K 2217/960715* (2013.01)

(58) Field of Classification Search
CPC .................. G06F 3/044; G06F 3/0418; G06F 2203/04108; H03K 17/955; H03K 2217/960715
See application file for complete search history.

(56) References Cited

U.S. PATENT DOCUMENTS

| 8,492,665 | B1 | 7/2013 | Yang ........................ 178/18.06 |
| 2012/0176179 | A1* | 7/2012 | Harders ............... H03K 17/962 327/517 |

(Continued)

FOREIGN PATENT DOCUMENTS

| CN | 102428481 A | 4/2012 |
| CN | 103475352 A | 12/2013 |
| EP | 2 464 008 A1 | 6/2012 |

*Primary Examiner* — Abhishek Sarma
(74) *Attorney, Agent, or Firm* — Harrington & Smith

(57) ABSTRACT

Embodiments of the present invention provide a capacitive sensing apparatus, a manufacturing and operation method thereof and an electronic device including the capacitive sensing apparatus. An apparatus includes first capacitive sensing unit(s) and second capacitive sensing unit, and a control unit. The control unit is configured to control periodic charging of the capacitive sensing units, determine first voltage change(s) for the first capacitive sensing unit(s) and second voltage change(s) for the second capacitive sensing unit(s), and calculate, for the first capacitive sensing unit(s), a signal-to-noise ratio value based on the first voltage change(s) and the second voltage change(s). Sensing results of first capacitive sensing unit(s) may be calibrated based on the sensing results of second capacitive sensing unit(s), thereby reducing influence of environmental changes on stability and sensitivity of a capacitive sensing apparatus.

20 Claims, 7 Drawing Sheets

(56) References Cited

U.S. PATENT DOCUMENTS

2016/0018921 A1\* 1/2016 Matlick ................ G06F 3/0416
345/174
2016/0018940 A1\* 1/2016 Lo ........................ G06F 3/0416
345/174

\* cited by examiner

In-hand

Near the face

Touching the face

Touching the face

METHOD AND APPARATUS FOR CAPACITIVE SENSING

TECHNICAL FIELD

Embodiments of the present invention generally relate to a technical field of sensing, and more specifically, to a method and apparatus for capacitive sensing.

BACKGROUND

Because of having high sensitivity, capacitive sensing devices have been widely used in electronic devices, such as Personal Digital Assistants (PDAs), mobile phones, tablets, computers, or the like. For example, a mobile phone may use a capacitive sensing touch screen as an input device, and may also use a capacitive proximity sensor for sensing proximity of an object, such as a human finger, a human face or the like.

Capacitance of a capacitive sensing device may vary with approaching of an object, e.g., a human finger, and therefore the device may sense proximity of the object. However, such high sensitivity may cause problems. For example, a capacitive sensing device may be susceptible to environmental changes because the capacitance may be easily changed due to the environmental changes, such as humidity, temperature, or dirt changes. As a result, if the environmental changes cause a change of the capacitance towards the same direction as that caused by the approaching object, i.e., both the capacitance values due to the approaching object and the environmental changes are positive or negative, the capacitive sensing device may become too sensitive. Furthermore, if the environmental changes cause a change of the capacitance towards an opposite direction compared with that caused by the approaching object, i.e., one of the capacitance values due to the approaching object and the environmental changes is positive and the other is negative, the capacitive sensing device may become too insensitive.

It is undesirable that environmental changes induce a capacitance change that may be interpreted as proximity of an object when actually such an object does not exist. Conversely, it is also undesirable that environmental changes cause a capacitance change due to an approaching object to be much smaller so that the proximity of the object may not be detected. Thus, there is a need for reducing the influence of environmental changes on the stability and sensitivity of a capacitive sensing device.

SUMMARY

There is provided a capacitive sensing apparatus, a manufacturing and operation method thereof and an electronic device comprising the capacitive sensing apparatus to reduce the influence of the environmental changes on stability and sensitivity of capacitive sensing. Technical advantages are generally achieved by embodiments of the present invention.

Various aspects of embodiments of the present invention are set forth in the appended claims and summarized in this section.

According to a first aspect of the present invention, there is provided an apparatus, which comprises: at least one first capacitive sensing unit; at least one second capacitive sensing unit; and a control unit configured to: control periodic charging of the at least one first capacitive sensing unit and the at least one second capacitive sensing unit; determine at least one first voltage change for the at least one first capacitive sensing unit and at least one second voltage change for the at least one second capacitive sensing unit; and for the at least one first capacitive sensing unit, calculate a signal-to-noise ratio (SNR) value based on the at least one first voltage change and the at least one second voltage change.

In one embodiment of the present invention, the apparatus further comprises an excitation source configured to charge the at least one first capacitive sensing unit and the at least one second capacitive sensing unit; and a charging monitor unit configured to detect a plurality of voltage values that are outputted by the at least one first capacitive sensing unit and the at least one second capacitive sensing unit during charging. The control unit is further configured to: control the excitation source to circularly charge the at least one first capacitive sensing unit and the at least one second capacitive sensing unit for a predetermined period of charging time; and based on the voltage values detected by the charging monitor unit, determine the at least one first voltage change for the at least one first capacitive sensing unit and the at least one second voltage change for the at least one second capacitive sensing unit.

In one embodiment of the present invention, the apparatus further comprises a plurality of first capacitive sensing units and a plurality of second capacitive sensing units. The control unit is further configured to: based on the voltage values detected by the charging monitor unit, determine a first set of voltage changes for the plurality of first capacitive sensing units and a second set of voltage changes for the plurality of second capacitive sensing units, a voltage change of the first set of voltage changes corresponding to one of the plurality of first capacitive sensing units and a voltage change of the second set of voltage changes corresponding to one of the plurality of second capacitive sensing units; and for each of the plurality of first capacitive sensing units, calculate a respective SNR value based on the second set of voltage changes and the corresponding voltage change of the first set of voltage changes.

In another embodiment of the present invention, the control unit is further configured to: determine a reference voltage change based on the second set of voltage changes; adjust each voltage change of the first set of voltage changes based on the reference voltage change; and calculate the respective SNR value based on each of the adjusted voltage changes.

In one embodiment of the present invention, the control unit is further configured to: determine at least one first charging time change for the at least one first capacitive sensing unit and at least one second charging time change for the at least one second capacitive sensing unit; and for the at least one first capacitive sensing unit, calculate a SNR value based on the at least one first charging time change and at least one second charging time change.

In one embodiment of the present invention, the charging monitor unit is further configured to detect a plurality of periods of charging time for charging the at least one first capacitive sensing unit and the at least one second capacitive sensing unit. The control unit is further configured to: control the excitation source to circularly charge the at least one first capacitive sensing unit and the at least one second capacitive sensing unit until the at least one first capacitive sensing unit and the at least one second capacitive sensing unit output a predetermined voltage value; based on the periods of charging time detected by the charging monitor unit, determine at least one first charging time change for the at least one first capacitive sensing unit and at least one second charging time change for the at least one second capacitive sensing unit.

In another embodiment of the present invention, the control unit is further configured to: based on the periods of charging time detected by the charging monitor unit, determine a first set of charging time changes for the plurality of first capacitive sensing units and a second set of charging time changes for the plurality of second capacitive sensing units, a charging time change of the first set of charging time changes corresponding to one of the plurality of first capacitive sensing units and a charging time change of the second set of charging time changes corresponding to one of the plurality of second capacitive sensing units; and for each of the plurality of first capacitive sensing units, calculate a respective SNR value based on the second set of charging time changes and the corresponding charging time change of the first set of charging time changes.

In one embodiment of the present invention, the control unit is further configured to: determine a reference charging time change based on the second set of charging time changes; adjust each charging time change of the first set of charging time changes based on the reference charging time change; and calculate the respective SNR value based on each of the adjusted charging time changes.

In another embodiment of the present invention, the at least one first capacitive sensing unit and the at least one second capacitive sensing unit are positioned closely.

In another embodiment of the present invention, the apparatus further comprises a capacitive touch screen. The at least one first capacitive sensing unit or the at least one second capacitive sensing unit is separate from or integral to the capacitive touch screen.

According to a second aspect of the present invention, there is provided a method, which comprises: providing at least one first capacitive sensing unit and at least one second capacitive sensing unit; and providing a control unit for: controlling periodic charging of the at least one first capacitive sensing unit and the at least one second capacitive sensing unit; determining at least one first voltage change for the at least one first capacitive sensing unit and at least one second voltage change for the at least one second capacitive sensing unit; and for the at least one first capacitive sensing unit, calculating a SNR value based on the at least one first voltage change and the at least one second voltage change.

In one embodiment of the present invention, the control unit is further providing for: determining at least one first charging time change for the at least one first capacitive sensing unit and at least one second charging time change for the at least one second capacitive sensing unit; and for the at least one first capacitive sensing unit, calculating a SNR value based on the at least one first charging time change and at least one second charging time change.

According to a third aspect of the present invention, there is provided a method which comprises: controlling by a control unit periodic charging of the at least one first capacitive sensing unit and the at least one second capacitive sensing unit; determining by the control unit at least one first voltage change for the at least one first capacitive sensing unit and at least one second voltage change for the at least one second capacitive sensing unit; and for the at least one first capacitive sensing unit, calculating by the control unit a signal-to-noise ratio (SNR) value based on the at least one first voltage change and the at least one second voltage change.

In one embodiment of the present invention, the method further comprises: determining by the control unit at least one first charging time change for the at least one first capacitive sensing unit and at least one second charging time change for the at least one second capacitive sensing unit; and for the at least one first capacitive sensing unit, calculating by the control unit a SNR value based on the at least one first charging time change and at least one second charging time change.

According to a fourth aspect of the present invention, there is provided an electronic device comprising a casing and the apparatus according to embodiments of the present invention.

According to embodiments of the present invention, sensing results of at least first capacitive sensing units may be calibrated base on the sensing results of at least one second capacitive sensing units, thereby reducing the influence of the environmental changes on stability and sensitivity of a capacitive sensing apparatus.

Other features and advantages of the embodiments of the present invention will also be understood from the following description of specific embodiments when read in conjunction with the accompanying drawings, which illustrate, by way of example, the principles of embodiments of the present invention.

BRIEF DESCRIPTION OF THE DRAWINGS

The above and other aspects, features, and benefits of various embodiments of the present invention will become more fully apparent, by way of example, from the following detailed description and the accompanying drawings, in which.

DETAILED DESCRIPTION

Hereinafter, some embodiments of the present invention will be described in more detail with reference to the accompanying drawings. Although some embodiments of the present invention are illustrated in the accompanying drawings, it should be understood that the present disclosure may be implemented in various manners and thus should not be construed as being limited to the embodiments described therein. To the contrary, those embodiments are provided for the thorough and complete understanding of the present disclosure, and for the capability of completely conveying the scope of the present disclosure to those skilled in the art.

Generally, all terms used in the claims are to be interpreted according to their ordinary meaning in the technical field, unless explicitly defined otherwise herein. All references to "a/an/the/said [element, device, component, means, step, etc]" are to be interpreted openly as referring to at least one instance of said element, device, component, means, unit, step, etc., without excluding a plurality of such devices, components, means, units, steps, etc., unless explicitly stated otherwise.

In an electronic device such as a mobile phone, a capacitive sensing device generally may be built with a number of capacitive sensing electrodes for detecting approaching or touching of an object, such as a user's finger or the like. A capacitance generated in the electrodes may include a background capacitance caused by noise including for example conducted noise, radiated noise or the like.

In a capacitive sensing device, signal-to-noise ratio (SNR) is usually used as a measure indicating how strong desired signal is when compared to undesired disturbances of noise. Generally, SNR is ratio of a capacitance variance to standard deviation of noise. Based on SNR, a position of an approaching or touching object in relation to the capacitive sensing device may be detected.

Figure 1:
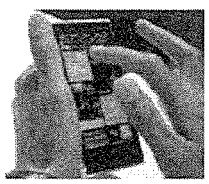
FIG. 1 illustrates a graph of SNR values versus capacitive electrode numbers in three scenarios.
Figure 1:
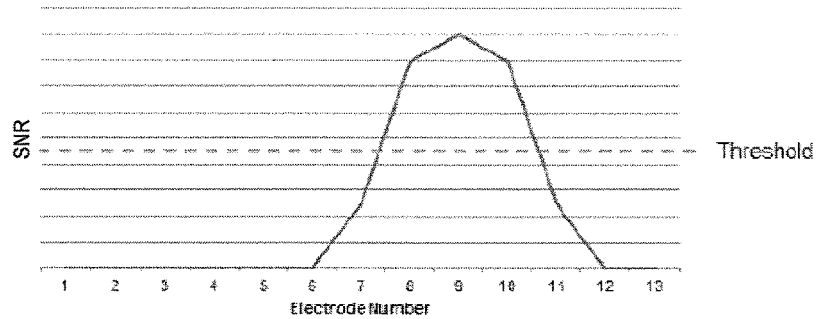
Figure 1:
Figure 1:
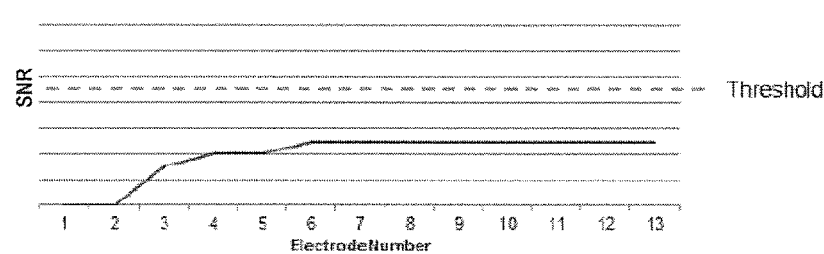
Figure 1:
Figure 1:
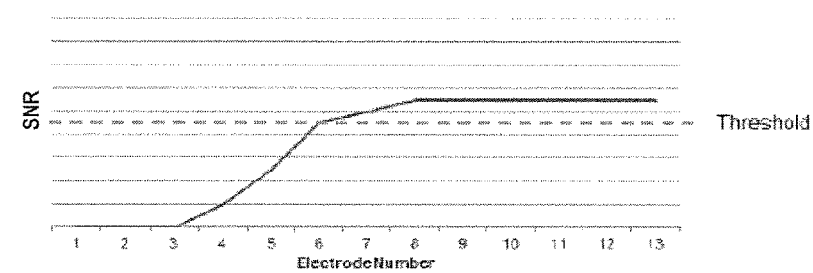

FIG. 1 illustrates a graph of SNR values versus capacitive electrode numbers in three application scenarios of a mobile phone. As illustrated in FIG. 1, a SNR reference threshold is predefined. When the mobile phone is held in a user's hand and manipulated by the user using his or her finger, the SNR values corresponding to a few electrodes significantly may exceed the threshold. When the mobile phone is near a user's head with the screen facing the outside, no SNR value exceeds the threshold. When the mobile phone is touching the face, SNR values corresponding to a great number of electrodes may exceed the threshold.

As illustrated in FIG. 1, the position of the object in relation to the capacitive sensing device may be detected according to SNR. In the practical application, the SNR reference threshold may be more than 50 for touch detection, and may be about 4 to 5 for proximity detection. In other words, when the SNR based on capacitance from the capacitive sensing device is more than 50, it may be determined that an object is touching the device; when the SNR is less than 50 but more than 5, it may be determined that an object is approaching the device. Such setting of SNR threshold may distinguish reliably between touching and approaching.

If the user carries the mobile phone from outdoor to indoor in a cold weather, the temperature may be increased rapidly, which may cause the baseline of SNR increased. In this case, a change in capacitance that is due to the approaching of an object may be interpreted as touching. Thus, the environmental changes may result in instability of capacitive sensing, and may further degrade user experience in touch operation.

Figure 2:
FIG. 2 illustrates a graph of SNR values versus capacitive electrode numbers in another scenario.
Figure 2:
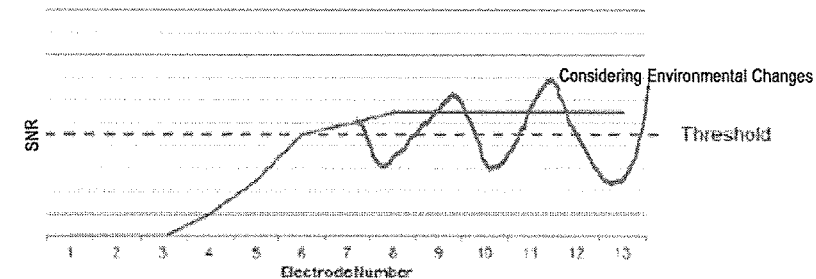

FIG. 2 illustrates a graph of SNR values versus capacitive electrode numbers in the scenario of a mobile phone touching the face when environment has changed. As illustrated in FIG. 2, SNR values fluctuate around the threshold due to environmental changes. Consequently, there is a need for reducing the influence of the environmental changes on a capacitive sensing apparatus.

Figure 3A:
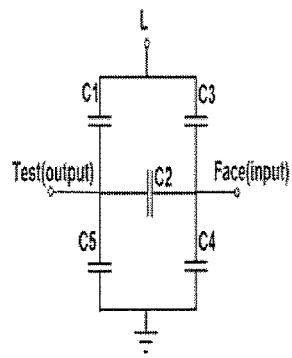
FIG. 3a illustrate a schematic equivalent circuit diagram of a capacitive sensing unit in one scenario in the prior art.
Figure 3B:
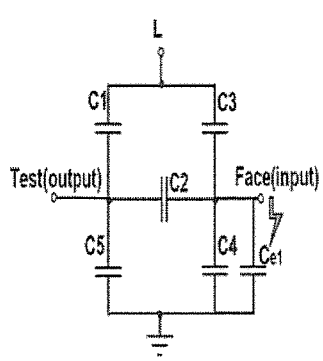
FIG. 3b illustrate a schematic equivalent circuit diagram of a capacitive sensing unit in another scenario in the prior art.

FIGS. 3a and 3b illustrate an equivalent schematic diagram of a capacitive sensing unit in the prior art, wherein FIG. 3a illustrates the equivalent schematic diagram when environment has not changed, and FIG. 3b illustrates the equivalent schematic diagram when environment has changed.

As illustrated in FIG. 3a, when environment has not changed, the capacitance at an output of the capacitive sensing unit may be equal to the capacitance due to for example approaching of a user's face at an input of the capacitive sensing unit. As illustrated in FIG. 3b, when environment has changed, the capacitance at the output may be equal to the capacitance due to the face plus a parasitic capacitance due to environmental changes, i.e., $C_{e1}$.

If the parasitic capacitance $C_{e1}$ as illustrated in FIG. 3b may be balanced out, the influence of environmental changes may be reduced. Based on such consideration, embodiments of the present invention provide an improved capacitive sensing apparatus and a manufacturing and operation method thereof. The conception of the present invention is using two capacitive sensors and calibrating sensing results of one sensor with the sensing results of another sensor so as to reduce the influence of the environmental changes.

Herein, some embodiments of the present invention are described in the context of a mobile phone. However, it should be appreciated that this is for the purpose of clarification but not limitation. It should also be appreciated that a mobile phone is merely illustrative of one type of electronic device in which the embodiments of the present invention may be implemented. The embodiment of the present invention may also be implemented in any other electronic devices, such as PDAs, tablets, digital cameras, video recorders, video gaming devices, audio media players, electronic books, computers, ATMs or any combination of the aforementioned.

Example embodiments of the present invention will be described in detail as below.

Figure 4:
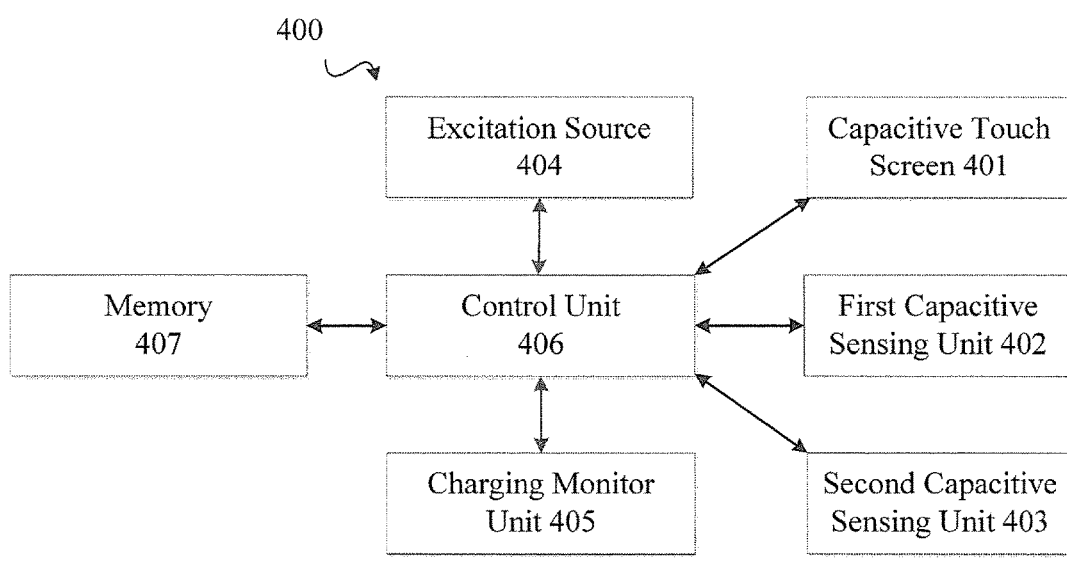
FIG. 4 illustrates a schematic diagram of an electronic device in which embodiments of the present invention may be implemented.

FIG. 4 illustrates a schematic diagram of an electronic device 400 in which embodiments of the present invention may be implemented.

As illustrated in FIG. 4, the electronic device 400, for example, a mobile phone, may comprise a capacitive touch screen 401, a first capacitive sensing unit 402, a second capacitive sensing unit 403, an excitation source 404 and a charging monitor unit 405, control unit 406, a memory 407.

According to embodiments of the present invention, the capacitive touch screen 401 may allow the electronic device 400 to display information such as menu options and any other service information and receive data inputted by a user.

According to embodiments of the present invention, the first and second capacitive sensing units 402 and 403 may have structures and functions similar to the capacitive touch screen 401. The two sensing units may sense touching or approaching of a user's finger or similar objects, and also sense environmental changes.

According to embodiment of the present invention, the excitation source 404 may be for example a common voltage or current excitation source, which is configured to charge the two capacitive sensing units 402 and 403.

According to embodiment of the present invention, the charging monitor unit 405 may be connected to the two capacitive sensing units 402 and 403 to monitor their charging status, including for example voltages to which the two capacitive sensing units have been charged voltage or periods of time for which the two capacitive sensing units have been charged.

According to embodiments of the present invention, the control unit 406 may be one or more general purpose or special purpose processors, which includes functionality to operate computer program code that may be stored in the memory 407. The memory 407 may include, for example, one or more volatile memories (e.g., registers, cache, RAM, etc.), one or more non-volatile memories (e.g., ROM, EEPROM, flash memory, etc.), or some combination thereof. The memory 407 may store information, data, applications, program code instructions or the like required for controlling operation and functions of the electronic device according to embodiments of the present invention.

According to some embodiments of the present invention, the control unit 406 may process data from the capacitive touch screen 401 and the first and second capacitive sensing units. In an embodiment of the present invention, the control unit 406 may be implemented in a touch integrated circuit (IC), which is specially designed for capacitive sensing. In the embodiment of the present invention, the memory 407 may be implemented as a register in the touch IC.

The electronic device 400 may also comprise other components generally present in such a device, such as a casing, a keypad, etc. (not shown in FIG. 4).

Figure 5:
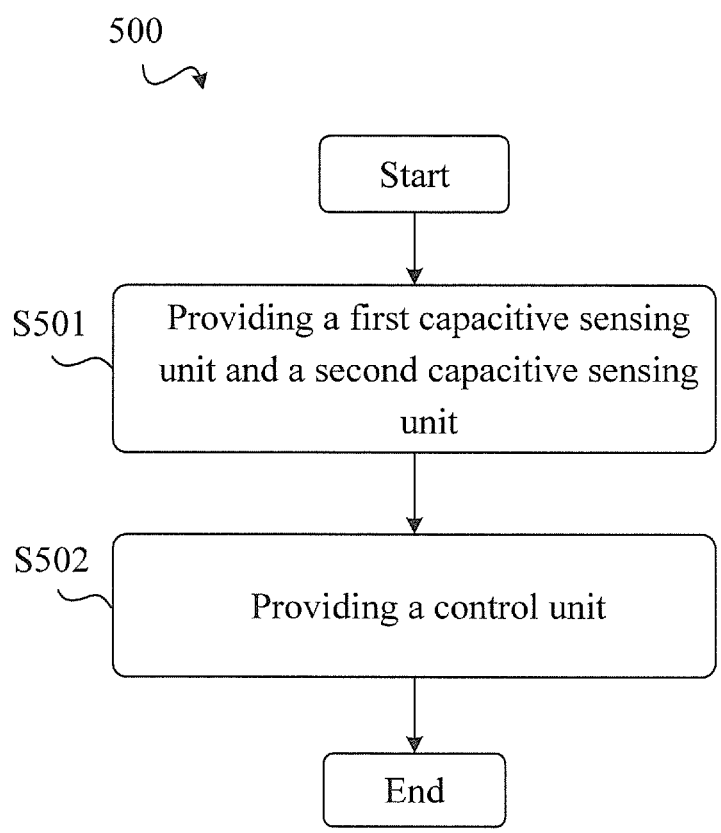
FIG. 5 illustrates a flow chart of a manufacturing method according to an embodiment of the present invention.

FIG. 5 illustrates a flow chart of a manufacturing method 500 according to an embodiment of the present invention.

As illustrated in FIG. 5, at step S501, a first capacitive sensing unit 402 and a second capacitive sensing unit 403 are provided. As described above, the first and second capacitive sensing units may sense environmental changes and touching or approaching of a user's finger or similar objects. According to an embodiment of the present invention, there may be also provided a plurality of first capacitive sensing units and a plurality of second capacitive sensing units.

Then, at step S502, the control unit 406 is provided. According to the embodiments of the present invention, the control unit 406 may control periodic charging of the first capacitive sensing unit and the second capacitive sensing unit for a predetermined period of charging time. The control unit 406 may also determine a first voltage change for the first capacitive sensing unit and a second voltage change for the second capacitive sensing unit. Furthermore, the control unit 406 may calculate, for the first capacitive sensing unit, a SNR value based on the first voltage change and the second voltage change.

It is well known that when a capacitor is being charged, there is a specific relationship between a voltage on the capacitor and the capacitance value. For example, when a voltage excitation source is used, the relationship is represented as Equation (1):

$$V_t = V_0 + (V_1 - V_0) \times [1 - \exp(-t/RC)] \quad (1)$$

wherein t is a period of charging time, $V_0$ is an initial voltage value on the capacitor, $V_1$ is a final voltage value on the capacitor which may be reached, $V_t$ is a voltage value on the capacitor after a period of charging time t, R is a resistance value and C is a capacitance value of the capacitor.

As indicated in Equation (1), if the period of charging time t is given, the voltage value on the capacitor $V_t$ is in inverse ratio to the capacitance value C. In other words, in the case of a given period of charging time, if the capacitance value of the capacitor has been changed, the voltage value on the capacitor has also been changed. As a result, the calculation of a SNR value for the first capacitive sensing unit based on voltage changes of the two capacitive sensing units as proposed by the embodiments of the present invention may reduce the influence of, e.g., the parasitic capacitance $C_{e1}$ as illustrated in FIG. 3b.

Figure 3C:
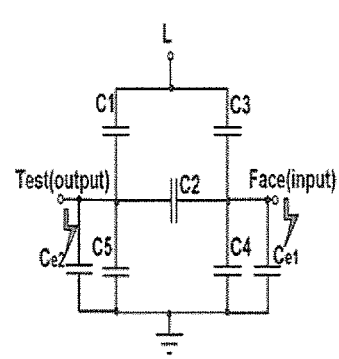
FIG. 3c illustrates a schematic equivalent circuit diagram of a capacitive sensing unit according to embodiments of the present invention.

In effect, the solution according to the embodiments of the present invention may be equivalent to adding a matching capacitor with a capacitance value $C_{e2}$ at the output to balance out $C_{e1}$ at the input as illustrated in FIG. 3c in which a schematic equivalent circuit diagram of a capacitive sensing unit according to embodiments of the present invention.

Now, returning to FIG. 5, according to another embodiment of the present invention, at step S502, the control unit 406 may be provided for determining a first charging time change for the first capacitive sensing unit and a second charging time change for the second capacitive sensing unit. Furthermore, the control unit 406 may calculate, for the first capacitive sensing unit, a SNR value based on the first charging time change and at second charging time change.

It is also well known that when a capacitor is being charged, there is also a specific relationship between a period of charging time and the capacitance value. By similarly taking the use of a voltage excitation source as an example, the relationship is represented as Equation (2):

$$t = RC \times Ln[(V_1 - V_0)/(V_1 - V_t)] \quad (2)$$

As indicated in Equation (2), if the voltage value on the capacitor is given, the period of charging time t is in direct ration to the capacitance value C. In other words, in the case of a given voltage value on the capacitor, if the capacitance value of the capacitor has been changed, the period of charging time has also been changed. As a result, the calculation of a SNR value for the first capacitive sensing unit based on charging time changes of the two capacitive sensing units as proposed by the embodiments of the present invention may also reduce the influence of environmental changes.

Figure 6:
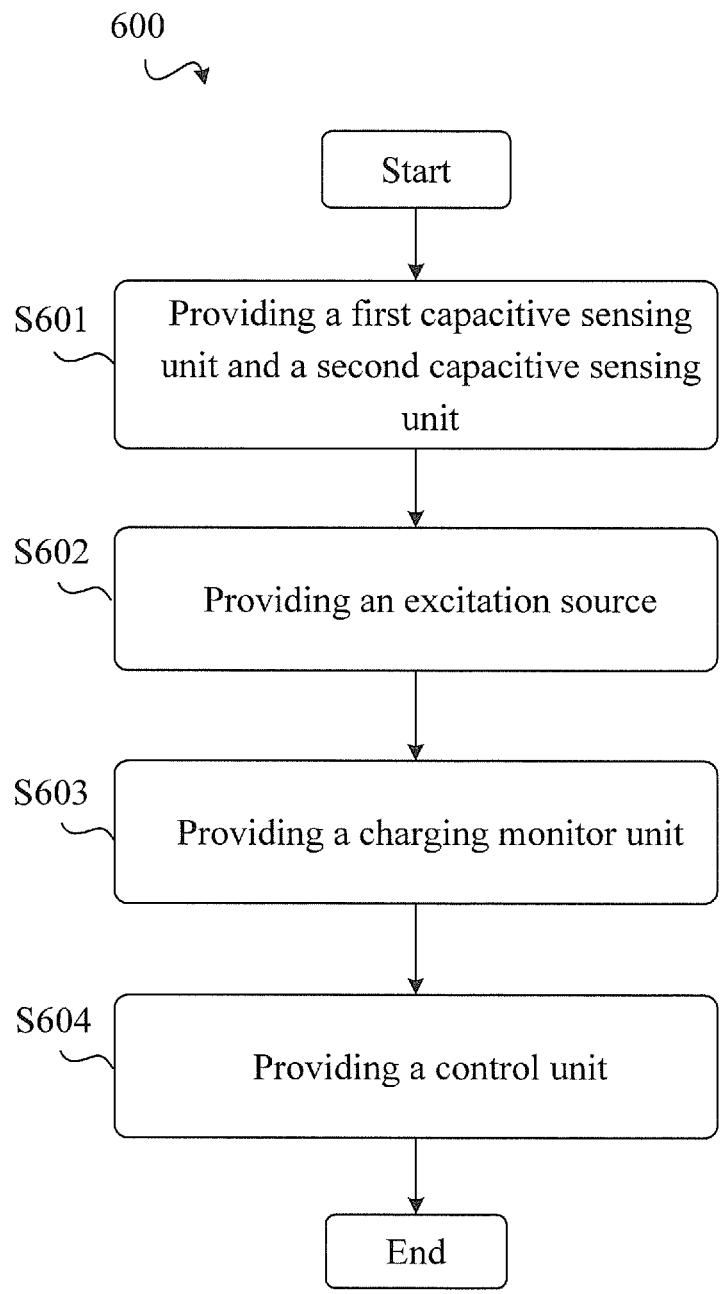
FIG. 6 illustrates a flow chart of a manufacturing method according to another embodiment of the present invention.

FIG. 6 illustrates a flow chart of a manufacturing method 600 according to another embodiment of the present invention.

As illustrated in FIG. 6, at step S601, a first capacitive sensing unit 402 and a second capacitive sensing unit 403 are provided. As described above, the first and second capacitive sensing units may sense environmental changes and touching or approaching of a user's finger or similar objects. According to an embodiment of the present invention, there may be also provided a plurality of first capacitive sensing units and a plurality of second capacitive sensing units.

Next, at step S602, the excitation source 404 is provided. According to an embodiment of the present invention, the excitation source 404 may charge the first and second capacitive sensing units. As described above, the excitation source 404 may be a voltage excitation source or a current excitation source.

At step S603, the charging monitor unit 405 is provided. According to the embodiments of the present invention, the charging monitor unit 405 may detect voltage values that may be outputted the first capacitive sensing unit and the second capacitive sensing unit during charging.

Then, at step S604, the control unit 406 is provided. According to the embodiments of the present invention, the control unit 406 may control the excitation source 404 to circularly charge the first capacitive sensing unit and the second capacitive sensing unit for a predetermined period of charging time. The control unit 406 may also determine, based on the voltage values detected by the charging monitor unit 405, a first voltage change for the first capacitive sensing unit and a second voltage change for the second capacitive sensing unit. Furthermore, the control unit 406 may calculate, for the first capacitive sensing unit, a SNR value based on the first voltage change and the second voltage change.

Alternatively, according to an embodiment of the present invention, when a plurality of first capacitive sensing units and a plurality of second capacitive sensing units may be provided at step S601, the control unit 406 may be further provided for determining, based on the voltage values detected by the charging monitor unit, a first set of voltage changes for the plurality of first capacitive sensing units and a second set of voltage changes for the plurality of second capacitive sensing units at step S604, wherein a voltage change of the first set of voltage changes corresponds to one of the plurality of first capacitive sensing units and a voltage change of the second set of voltage changes corresponds to one of the plurality of second capacitive sensing units. Also at step S604, the control unit 406 may be provided for calculating, for each of the plurality of first capacitive sensing units, a respective SNR value based on the second set of voltage changes and the corresponding voltage change of the first set of voltage changes.

According to an embodiment of the present invention, the control unit 406 may determine a reference voltage change based on the second set of voltage changes, adjust each voltage change of the first set of voltage changes based on the reference voltage change, and calculate the respective SNR value based on each of the adjusted voltage changes.

According to an embodiment of the present invention, the reference voltage change may be determined based on a probability or average rule. For example, the average value of the second set of voltage changes may be calculated and be selected as the reference voltage change. Alternatively, the voltage change of the second set of voltage changes the number of which is a maximum may be selected as the reference voltage change. Alternatively, the reference capacitance variance may also be determined based on Least Square algorithm or the like.

Returning to FIG. 6, according to another embodiment of the present invention, at step S603, the charging monitor unit 405 may be provided for detecting a plurality of periods of charging time for charging the two capacitive sensing units.

According to the embodiment of the present invention, at step S604, the control unit 406 may be provided for controlling the excitation source 404 to circularly charge the first capacitive sensing unit and the second capacitive sensing unit until the two capacitive sensing units may output a predetermined voltage value. The control unit 406 may also determine, based on the periods of charging time detected by the charging monitor unit 405, a first charging time change for the first capacitive sensing unit and a second charging time change for the second capacitive sensing unit. Furthermore, the control unit 406 may calculate, for the first capacitive sensing unit, a SNR value based on the first charging time change and at second charging time change.

Alternatively, according to an embodiment of the present invention, when a plurality of first capacitive sensing units and a plurality of second capacitive sensing units may be provided at S601, the control unit 406 may be provided for determining, based on the periods of charging time detected by the charging monitor unit 404, a first set of charging time changes for the plurality of first capacitive sensing units and a second set of charging time changes for the plurality of second capacitive sensing units at step S604, wherein a charging time change of the first set of charging time changes corresponds to one of the plurality of first capacitive sensing units and a charging time change of the second set of charging time changes corresponds to one of the plurality of second capacitive sensing units. Also at step S604, the control unit 406 may be provided for calculating, for each of the plurality of the first capacitive sensing units, a respective SNR value based on the second set of charging time changes and the corresponding charging time change of the first set of charging time changes.

According to an embodiment of the present invention, the control unit 406 may determine a reference charging time change based on the second set of charging time changes, adjust each charging time change of the first set of charging time changes based on the reference charging time change, and calculate the respective SNR value based on each of the adjusted charging time changes.

Likewise, the selection of the reference charging time change may be based on a probability or average rule, and may be alternatively based on Least Square algorithm or the like.

Hereinafter, with respect to FIG. 7, electronic layouts of an electronic device having a capacitive sensing apparatus according to an embodiment of the present invention will be described.

According to an embodiment of the present invention, as described above, the electronic device may have at least one first capacitive sensing unit and at least one second capacitive sensing unit. The first capacitive sensing unit and the second capacitive sensing unit may be positioned closely so that the influence of environmental changes may be effectively reduced.

Figure 7:
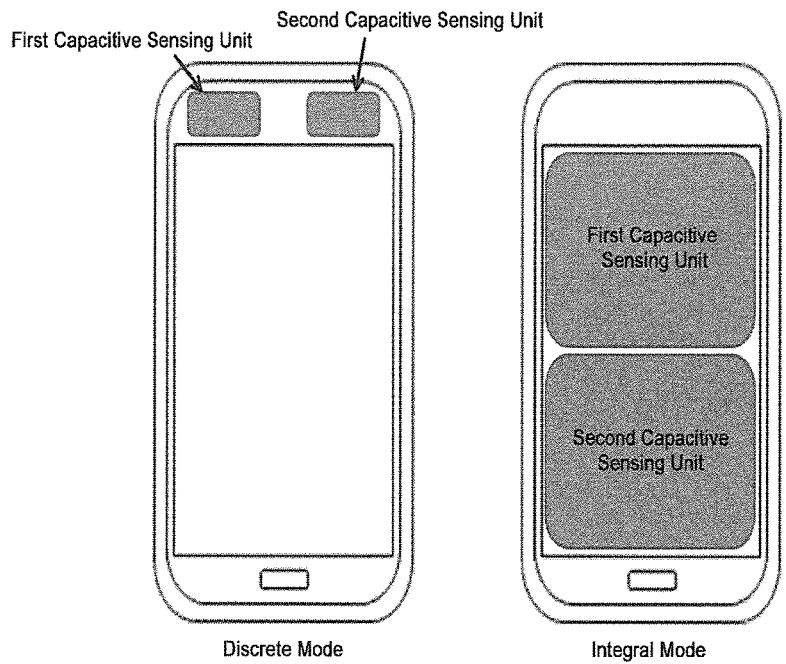
FIG. 7 illustrates electronic layouts of an electronic device having a capacitive sensing apparatus according to an embodiment of the present invention.

Additionally, two specific modes of electrode layouts are illustrated in FIG. 7, which may be referred as a discrete mode and an integral mode. In the discrete mode, the two capacitive sensing units are both physically separate from the capacitive touch screen, and for example one is positioned on the upper left corner of the electronic device and the other is positioned on the upper right corner of the electronic device. In the integral mode, the two capacitive sensing units are both integral to the capacitive touch screen, and for example one is positioned in the upper half of the touch screen and the other is positioned in the lower half of the touch screen.

It should be appreciated that the electrode layouts illustrated in FIG. 7 are only illustrative but not limitative. For example, with respect to the discrete mode, the two capacitive sensing units may be both positioned on the left corner of the electronic device. With respect to the integral mode, one capacitive sensing unit may be positioned in the left half of the touch screen and the other may be positioned in the right half of the touch screen. Alternatively, there may be also a mixed mode, wherein one of the two capacitive sensing units may be separate from the capacitive touch screen and the other may be integral to the touch screen. For example, the first capacitive sensing unit may be integral to the capacitive touch screen, and the second capacitive sensing unit is separately positioned, for example, at the bottom of the electronic device. Alternatively, the first capacitive sensing unit may be separately positioned, for example, at the top of the electronic device, and the second capacitive sensing unit may be integral to the capacitive touch screen and for example be positioned in the upper half of the touch screen.

Figure 8:
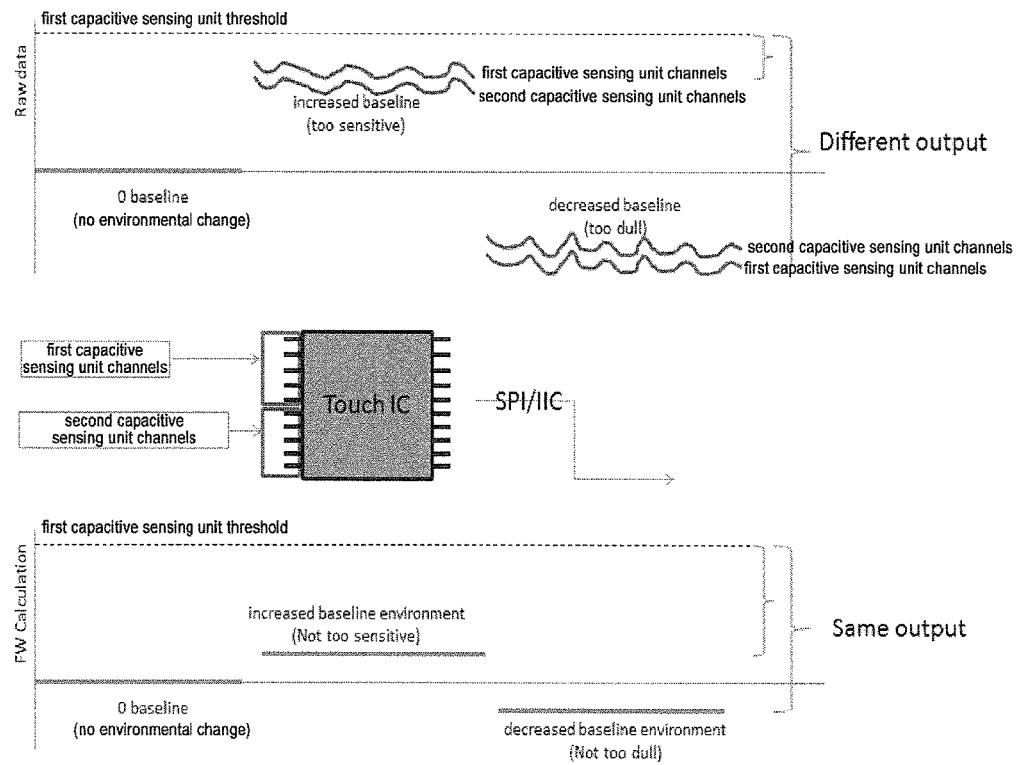
FIG. 8 illustrates a schematic diagram of implementing embodiments of the present invention by using a touch integrated circuit (IC)

According to an embodiment of the present invention, as describe above, the control unit 406 may be implemented in a touch IC. FIG. 8 illustrates a schematic diagram of implementing embodiments of the present invention by using a touch IC.

According to an embodiment of the present invention, each of the first and second capacitive sensing units may have a plurality of input and output sensing channels, and each sensing channel may be connected to a pin of the touch IC. The touch IC may have an excitation source such as a voltage excitation source to charge the two sensing units through the respective input sensing channels. Furthermore, the touch IC may monitor voltage values that may be outputted by the first and second capacitive sensing units through the respective output sensing channel. The touch IC may also monitor a period of charging time for charging the two capacitive sensing units. The processor in the touch IC may implement the functions of the control unit as described above with respect to FIGS. 5 and 6. For the purpose of simplicity, the detailed description will be omitted.

As illustrated in FIG. 8, by using the solution proposed by the embodiments of the present invention, the baseline of SNR may be adjusted to a desirable level, and thereby the influence of environmental changes may be reduced.

Figure 9:
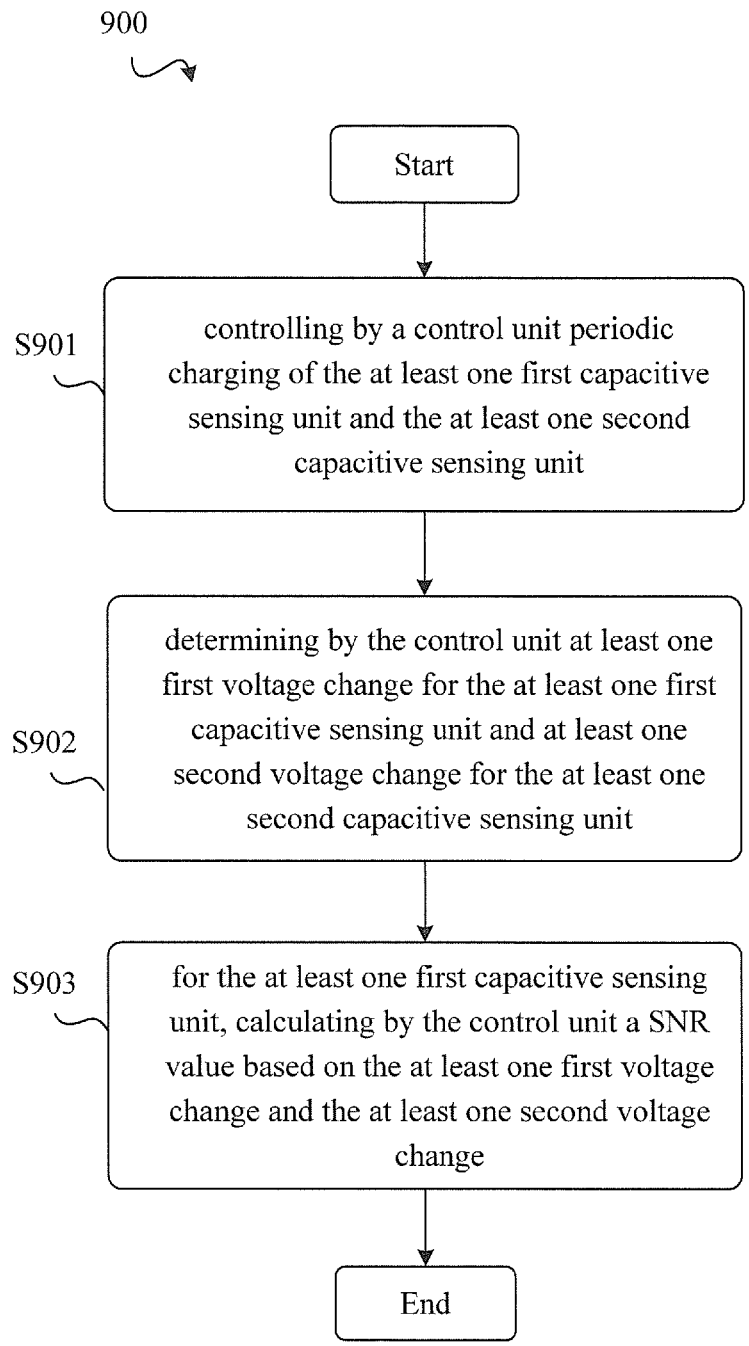
FIG. 9 illustrates a flow chart of an operating method according to an embodiment of the present invention.
Figure 10:
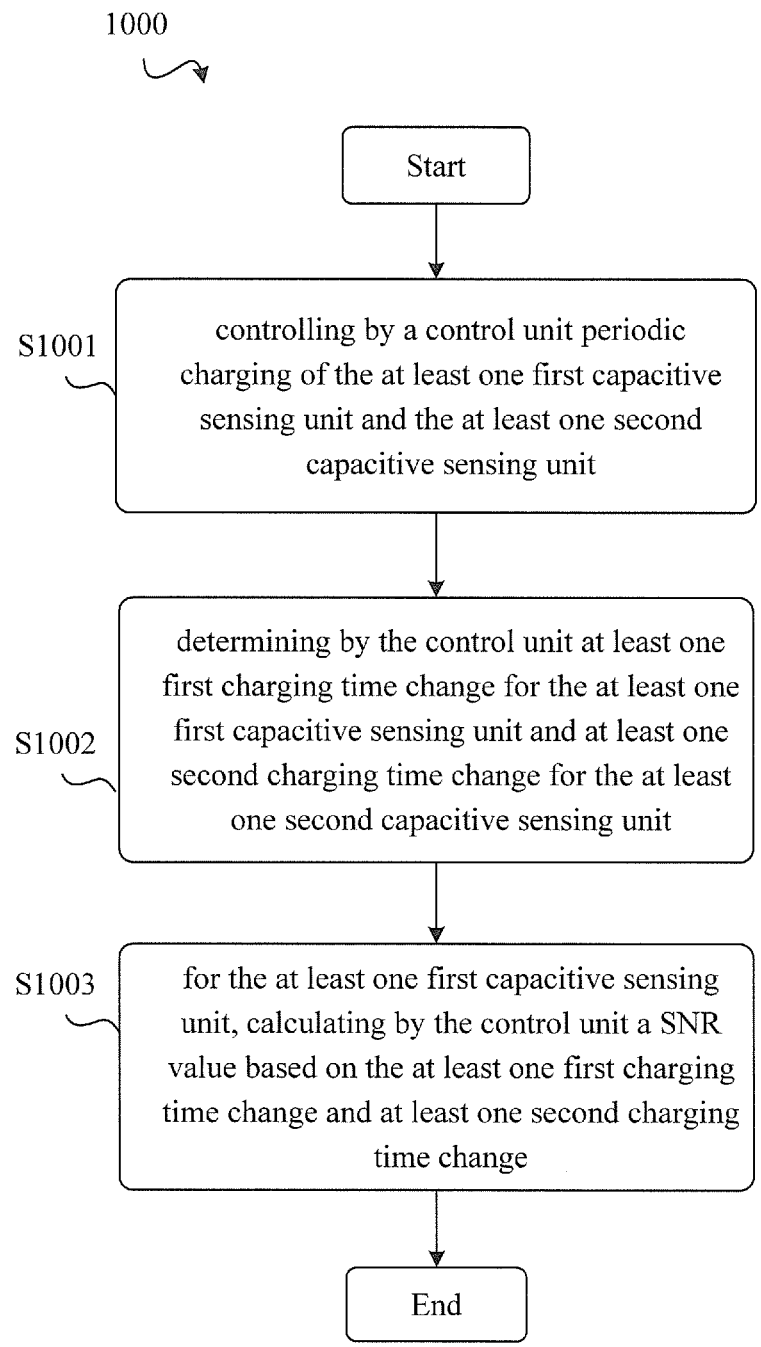
FIG. 10 illustrates a flow chart of an operating method according to another embodiment of the present invention.

Now, with respect to FIGS. 9 and 10, operation methods according to embodiments of the present invention may be described, wherein FIG. 9 illustrates a flow chart of an operating method 900 according to an embodiment of the present invention, and FIG. 9 illustrates a flow chart of an operating method 900 according to another embodiment of the present invention.

As illustrated in FIG. 9, after the method 900 starts, at step S901, the control unit 406 may control periodic charging of the at least one first capacitive sensing unit and the at least one second capacitive sensing unit. Next, at step S902, the control unit 406 may determine at least one first voltage change for the at least one first capacitive sensing unit and at least one second voltage change for the at least one second capacitive sensing unit. Then, at step S903, the control unit 406 may calculate, for the at least one first capacitive sensing unit, a SNR value based on the at least one first voltage change and the at least one second voltage change.

As illustrated in FIG. 10, after the method 1000 starts, at step S1001, the control unit 406 may control periodic charging of the at least one first capacitive sensing unit and the at least one second capacitive sensing unit. Next, at step S1002, the control unit 406 may determine at least one first charging time change for the at least one first capacitive sensing unit and at least one second charging time change for the at least one second capacitive sensing unit. Then, at step S1003, the control unit 406 may calculate, for the at least one first capacitive sensing unit, a SNR value based on the at least one first charging time change and at least one second charging time change.

It should be appreciated that the functions of the components described with respect to FIGS. 5 and 6 may also be implemented by the respective components in the operating methods as illustrated in FIGS. 9 and 10. For the purpose of simplicity, the detailed description will be omitted.

Exemplary embodiments of the present invention have been described above with reference to block diagrams and flowchart illustrations of devices and methods. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus to produce a machine, such that the instructions which execute on the computer or other programmable data processing apparatus create means for implementing the functions specified in the flowchart block or blocks.

While operations are depicted in the drawings in a particular order, this should not be understood as requiring that such operations be performed in the particular order illustrated or in sequential order, or that all illustrated operations be performed, to achieve desirable results. In certain circumstances, multitasking and parallel processing may be advantageous.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments.

What is claimed is:

1. An apparatus, comprising:
   at least one first capacitive sensing unit;
   at least one second capacitive sensing unit; and
   a control unit configured to:
   control charging of the at least one first capacitive sensing unit and the at least one second capacitive sensing unit;
   determine at least one first voltage change for the at least one first capacitive sensing unit and at least one second voltage change for the at least one second capacitive sensing unit; and
   for the at least one first capacitive sensing unit, calculate a signal-to-noise ratio (SNR) value based on the at least one first voltage change and the at least one second voltage change.

2. The apparatus of claim 1, further comprising:
   an excitation source configured to charge the at least one first capacitive sensing unit and the at least one second capacitive sensing unit; and
   a charging monitor unit configured to detect a plurality of voltage values that are outputted by the at least one first capacitive sensing unit and the at least one second capacitive sensing unit during charging;
   wherein the control unit is further configured to:
   control the excitation source to circularly charge the at least one first capacitive sensing unit and the at least one second capacitive sensing unit for a predetermined period of time; and
   based on the voltage values detected by the charging monitor unit, determine the at least one first voltage change for the at least one first capacitive sensing unit and the at least one second voltage change for the at least one second capacitive sensing unit.

3. The apparatus of claim 2, further comprising a plurality of first capacitive sensing units and a plurality of second capacitive sensing units, and wherein the control unit is further configured to:
   based on the voltage values detected by the charging monitor unit, determine a first set of voltage changes for the plurality of first capacitive sensing units and a second set of voltage changes for the plurality of second capacitive sensing units, a voltage change of the first set of voltage changes corresponding to one of the plurality of first capacitive sensing units and a voltage change of the second set of voltage changes corresponding to one of the plurality of second capacitive sensing units; and
   for each of the plurality of first capacitive sensing units, calculate a respective SN value based on the second set of voltage changes and the corresponding voltage change of the first set of voltage changes.

4. The apparatus of claim 3, wherein the control unit is further configured to:

determine a reference voltage change based on the second set of voltage changes;

adjust each voltage change of the first set of voltage changes based on the reference voltage change; and calculate the respective SNR value based on each of the adjusted voltage changes.

5. The apparatus of claim 1, wherein the control unit is further configured to:

determine at least one first charging time change for the at least one first capacitive sensing unit and at least one second charging time change for the at least one second capacitive sensing unit; and for the at least one first capacitive sensing unit, calculate a SNR value based on the at least one first charging time change and at least one second charging time change.

6. The apparatus of claim 5, further comprising:

an excitation source configured to charge the at least one first capacitive sensing unit and the at least one second capacitive sensing unit; and a charging monitor unit configured to detect a plurality of periods of charging time for charging the at least one first capacitive sensing unit and the at least one second capacitive sensing unit;

wherein the control unit is further configured to:

control the excitation source to charge the at least one first capacitive sensing unit and the at least one second capacitive sensing unit until the at least one first capacitive sensing unit and the at least one second capacitive sensing unit output a predetermined voltage value; and based on the periods of charging time detected by the charging monitor unit, determine at least one first charging time change for the at least one first capacitive sensing unit and at least one second charging time change for the at least one second capacitive sensing unit.

7. The apparatus of claim 6, further comprising a plurality of first capacitive sensing units and a plurality of second capacitive sensing units, and wherein the control unit is further configured to:

based on the periods of charging time detected by the charging monitor unit, determine a first set of charging time changes for the plurality of first capacitive sensing units and a second set of charging time changes for the plurality of second capacitive sensing units, a charging time change of the first set of charging time changes corresponding to one of the plurality of first capacitive sensing units and a charging time change of the second set of charging time changes corresponding to one of the plurality of second capacitive sensing units; and for each of the plurality of first capacitive sensing units, calculate a respective SN value based on the second set of charging time changes and the corresponding charging time change of the first set of charging time changes.

8. The apparatus of claim 7, wherein the control unit is further configured to:

determine a reference charging time change based on the second set of charging time changes;

adjust each charging time change of the first set of charging time changes based on the reference charging time change; and calculate the respective SNR value based on each of the adjusted charging time changes.

9. The apparatus of claim 1, wherein the at least one first capacitive sensing unit and the at least one second capacitive sensing unit are positioned closely.

10. The apparatus of claim 9, further comprising a capacitive touch screen, and wherein the at least one first capacitive sensing unit or the at least one second capacitive sensing unit is separate from or integral to the capacitive touch screen.

11. The apparatus of claim 1, wherein the apparatus is part of an electronic device that comprises a casing.

12. A method, comprising:

providing at least one first capacitive sensing unit and at least one second capacitive sensing unit; and providing a control unit for:

controlling periodic charging of the at least one first capacitive sensing unit and the at least one second capacitive sensing unit;

determining at least one first voltage change for the at least one first capacitive sensing unit and at least one second voltage change for the at least one second capacitive sensing unit; and for the at least one first capacitive sensing unit, calculating a signal-to-noise ratio (SNR) value based on the at least one first voltage change and the at least one second voltage change.

13. A method, comprising:

controlling by a control unit periodic charging of at least one first capacitive sensing unit and at least one second capacitive sensing unit;

determining by the control unit at least one first voltage change for the at least one first capacitive sensing unit and at least one second voltage change for the at least one second capacitive sensing unit; and for the at least one first capacitive sensing unit, calculating by the control unit a signal-to-noise ratio (SNR) value based on the at least one first voltage change and the at least one second voltage change.

14. The method of claim 13, comprising:

controlling by the control unit an excitation source to circularly charge at least one first capacitive sensing unit and at least one second capacitive sensing unit for a predetermined period of charging time;

detecting by a charging monitor unit a plurality of voltage values that are outputted by the at least one first capacitive sensing unit and the at least one second capacitive sensing unit during charging; and based on the voltage values detected by the charging monitor unit, determining by the control unit at least one first voltage change for the at least one first capacitive sensing unit and at least one second voltage change for the at least one second capacitive sensing unit.

15. The method of claim 14, further comprising:

based on the voltage values detected by the charging monitor unit, determining by the control unit a first set of voltage changes for a plurality of first capacitive sensing units and a second set of voltage changes for a plurality of second capacitive sensing units, a voltage change of the first set of voltage changes corresponding to one of the plurality of first capacitive sensing units and a voltage change of the second set of voltage changes corresponding to one of the plurality of second capacitive sensing units; and for each of the plurality of first capacitive sensing units, calculating by the control unit a respective SNR value based on the second set of voltage changes and the corresponding voltage change of the first set of voltage changes.

16. The method of claim 15, further comprising:
determining by the control unit a reference voltage change based on the second set of voltage changes;
adjusting by the control unit each voltage change of the first set of voltage changes based on the reference voltage change; and
calculating by the control unit the respective SNR value based on each of the adjusted voltage changes.

17. The method of claim 13, further comprising:
determining by the control unit at least one first charging time change for the at least one first capacitive sensing unit and at least one second charging time change for the at least one second capacitive sensing unit; and
for the at least one first capacitive sensing unit, calculating by the control unit a SNR value based on the at least one first charging time change and at least one second charging time change.

18. The method of claim 17, further comprising:
controlling by the control unit an excitation source to circularly charge the at least one first capacitive sensing unit and the at least one second capacitive sensing unit until the at least one first capacitive sensing unit and the at least one second capacitive sensing unit output a predetermined voltage value;
detecting by a charging monitor unit a plurality of periods of charging time for charging the at least one first capacitive sensing unit and the at least one second capacitive sensing unit; based on the periods of charging time detected by the charging monitor unit, determining by the control unit at least one first charging time change for the at least one first capacitive sensing unit and at least one second charging time change for the at least one second capacitive sensing unit.

19. The method of claim 18, further comprising:
based on the periods of charging time detected by the charging monitor unit, determining by the control unit a first set of charging time changes for a plurality of first capacitive sensing units and a second set of charging time changes for a plurality of second capacitive sensing units, a charging time change of the first set of charging time changes corresponding to one of the plurality of first capacitive sensing units and a charging time change of the second set of charging time changes corresponding to one of the plurality of second capacitive sensing units; and
for each of the plurality of the first capacitive sensing units, calculating by the control unit a respective SNR value based on the second set of charging time changes and the corresponding charging time change of the first set of charging time changes.

20. The method of claim 19, further comprising:
determining by the control unit a reference charging time change based on the second set of charging time changes;
adjusting by the control unit each charging time change of the first set of charging time changes based on the reference charging time change; and
calculating by the control unit the respective SNR value based on each of the adjusted charging time changes.

* * * * *